United States Patent [19]
Iranmanesh

[11] Patent Number: 5,663,591
[45] Date of Patent: Sep. 2, 1997

[54] ANTIFUSE WITH DOUBLE VIA, SPACER-DEFINED CONTACT

[75] Inventor: Ali Iranmanesh, Sunnyvale, Calif.

[73] Assignee: Crosspoint Solutions, Inc., Santa Clara, Calif.

[21] Appl. No.: 388,673

[22] Filed: Feb. 14, 1995

[51] Int. Cl.$^6$ .................. H01L 29/04; H01L 29/00
[52] U.S. Cl. .................. 257/530; 257/50; 257/52
[58] Field of Search .................. 257/50, 529, 530, 257/52

[56] References Cited

U.S. PATENT DOCUMENTS

| | | | |
|---|---|---|---|
| 3,675,090 | 7/1972 | Neale | 317/234 R |
| 4,217,374 | 8/1980 | Ovshinsky et al. | 427/39 |
| 4,226,898 | 10/1980 | Ovshinsky et al. | 427/39 |
| 4,499,557 | 2/1985 | Holmberg et al. | 365/163 |
| 4,748,490 | 5/1988 | Hollingsworth | 357/51 |
| 5,070,384 | 12/1991 | McCollum et al. | 357/51 |
| 5,100,827 | 3/1992 | Lytle | 437/52 |
| 5,106,773 | 4/1992 | Chen et al. | 437/51 |
| 5,120,679 | 6/1992 | Boardman et al. | 437/195 |
| 5,166,556 | 11/1992 | Hsu et al. | 307/465 |
| 5,181,096 | 1/1993 | Forouhi | 257/530 |
| 5,191,241 | 3/1993 | McCollum et al. | 307/465 |
| 5,196,724 | 3/1993 | Gordon et al. | 257/530 |
| 5,210,598 | 5/1993 | Nakazaki et al. | 257/530 |
| 5,233,217 | 8/1993 | Dixit et al. | 257/530 |
| 5,248,632 | 9/1993 | Tung et al. | 437/195 |
| 5,250,464 | 10/1993 | Wong et al. | 437/170 |
| 5,272,101 | 12/1993 | Forouhi et al. | 257/530 |
| 5,284,788 | 2/1994 | Spratt et al. | 437/52 |
| 5,290,734 | 3/1994 | Boardman et al. | 437/195 |
| 5,322,812 | 6/1994 | Dixit et al. | 437/60 |
| 5,328,865 | 7/1994 | Boardman et al. | 437/60 |
| 5,329,153 | 7/1994 | Dixit | 257/530 |
| 5,362,676 | 11/1994 | Gordon et al. | 437/192 |
| 5,369,054 | 11/1994 | Yen et al. | 257/530 |
| 5,373,169 | 12/1994 | McCollum et al. | 257/50 |
| 5,374,832 | 12/1994 | Tung et al. | 257/50 |
| 5,381,035 | 1/1995 | Chen et al. | 257/530 |
| 5,384,481 | 1/1995 | Holzworth et al. | 257/530 |
| 5,387,812 | 2/1995 | Forouhi et al. | 257/530 |
| 5,404,029 | 4/1995 | Husher et al. | 257/530 |
| 5,411,917 | 5/1995 | Forouhi et al. | 437/195 |
| 5,440,167 | 8/1995 | Iranmanesh | 257/530 |
| 5,451,810 | 9/1995 | Tigelaar et al. | 257/530 |

FOREIGN PATENT DOCUMENTS

| | | | |
|---|---|---|---|
| 0583119 | 2/1994 | European Pat. Off. | 257/530 |
| WO 92/13359 | 8/1992 | WIPO | H01L 21/285 |
| WO 94/05041 | 3/1994 | WIPO | H01L 23/525 |

OTHER PUBLICATIONS

G. H. Chapman, et al., "A Laser Linking Process for Restructurable VLSI", *CLEO '82* (Apr. 1982), pp. 1–5.

Primary Examiner—Mahshid D. Saadat
Assistant Examiner—Valencia Martin Wallace
Attorney, Agent, or Firm—Townsend and Townsend and Crew LLP

[57] ABSTRACT

The present invention provides for a method of forming an antifuse in an integrated circuit having a first insulating layer on a semiconductor substrate. The method comprises forming a first metal interconnection layer on the first insulating layer; forming a relatively thin, second insulating layer over the first metal interconnection layer with a via where the antifuse is to be located to expose the first metal interconnection layer; forming first spacer regions on the sidewalls of the second insulating layer; forming a programming layer on the second insulating layer and in the via to contact the first metal interconnection line; forming second spacer regions on the sidewalls of the programming layer in the via; forming a barrier metal layer on the programming layer; forming a relatively thick, third insulating layer on the barrier metal layer with a second aperture to expose a portion of the barrier metal layer; and forming a second metal interconnection layer on the third insulating layer and in the second aperture to contact the portion of the second barrier metal layer. The spacer regions force programming to occur away from the sidewalls of the via for greater uniformity of programming voltages and greater stability on the $R_{ON}$ resistance. Additionally, the capacitance of the unprogrammed antifuse is reduced.

38 Claims, 3 Drawing Sheets

5,663,591

ANTIFUSE WITH DOUBLE VIA, SPACER-DEFINED CONTACT

BACKGROUND OF THE INVENTION

The present invention is related to integrated circuit structure and processing technology and, more particularly, to antifuses in integrated circuits and their manufacture.

Antifuses are found in a growing number of integrated circuits, most of which are field programmable gate arrays (FPGAs). As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typically antifuse structure a programming layer is sandwiched between two metal interconnection lines. Depending upon the material of each metal interconnection layer and the programming layer, amorphous silicon commonly, a layer of barrier metal, such as TiW (titanium-tungsten), may be added between the programming layer and each metal interconnection layer. Barrier metal layers function to block the undesired interdiffusion of a programming layer, such as amorphous silicon, and a metal layer, such as aluminum alloy. Barrier metal layers are typically refractory metals, their intermetallics, alloys, silicides, nitrides and combinations thereof.

However, various problems have been found with present antifuses. One problem is reliability. The resistance of the programmed antifuse, $R_{ON}$, is sometimes unstable. With use, $R_{ON}$ sometimes drifts and increases to very high values which result in a device failure. For the programmed FPGA, the failure of one antifuse is disastrous since the programmed circuit is no longer realized in the integrated circuit. This problem is believed to be caused by the deposition of the programming layer into deep vias through a thick interlayer dielectric between the metal interconnection layers. This leads to severe step coverage problems created by the deep via, i.e., an uneven deposition of the programming layer in the via, especially the corners of the via.

An antifuse structure described in U.S. Pat. No. 5,100,827, which issued on Mar. 31, 1992 to S. A. Lytle, attempts to solve this problem. The described antifuse partially addresses some of the problems of poor step coverage. Nonetheless, the antifuse structure still retains some of the disadvantages discussed above, i.e., the sharp, albeit shallower, corners in the programming and the metal interconnection layer above.

Moreover, the described antifuse structure fails to account for the parasitic capacitances of the unprogrammed antifuse. Such a failure results in the poor performance of an integrated circuit having a large number of antifuses. In present FPGAs the number of antifuses range from tens to hundreds of thousands of antifuses.

The present invention solves or substantially mitigates both problems of reliability and performance.

SUMMARY OF THE INVENTION

The present invention provides for a method of forming an antifuse in an integrated circuit having a first insulating layer on a semiconductor substrate. Starting with the step of forming a first metal interconnection layer on the first insulating layer, the method follows with the steps of forming first spacer regions against the sides of the first metal interconnection layer, forming a relatively thin, second insulating layer over the first metal interconnection layer and the first insulating layer; forming a first aperture through the second insulating layer where the antifuse is to be located; and forming a second spacer region in the first aperture on the sides of the first aperture. A programming layer is then formed on the second insulating layer and on the second spacer region to contact the first metal interconnection layer. The programming layer conformally follows the second spacer region into the first aperture and the sides of the programming layer. A third spacer region is formed along the sides of the programming layer in the first aperture. A barrier metal layer is formed on the third spacer region to contact the programming layer; and a relatively thick, third insulating layer is formed on the barrier metal layer. A second aperture is created through the third insulating layer to expose a portion of the barrier metal layer; and a second metal interconnection layer on the third insulating layer to contact the portion of the second barrier metal layer is formed.

Thus in accordance with the present invention, the resulting antifuse structure in an integrated circuit has a first metal interconnection layer with first spacer regions on its sides and on a first insulating layer; a relatively thin, second insulating layer over the first metal interconnection layer and the first insulating layer, the second insulating layer having a first aperture therethrough where the antifuse is to be located, the first aperture forming sides of the second insulating layer; a second spacer region in the first aperture on the sides of the first second insulating layer; a programming layer on the second insulating layer and on the second spacer region contacting the first metal interconnection layer, the programming layer conformally following the second spacer region into the first aperture and forming sides of the programming layer; a third spacer region on the sides of the programming layer; a barrier metal layer on the programming layer and on the second spacer region contacting the programming layer; a relatively thick, third insulating layer on the barrier metal layer; a third insulating layer having a second aperture therethrough exposing a portion of the barrier metal layer; and a second metal interconnection layer on the third insulating layer contacting the portion of-the second barrier metal layer.

The first spacer region improves step coverage so that the programming layer can be formed with uniform thickness. The second and third spacer regions force programming Sway from the first aperture sides to permit relatively consistent programming voltages for said antifuse structure and a relatively uniform conducting link between the first and second interconnection lines. Furthermore, the third spacer regions define a smaller contact area for the barrier metal layer and the programming layer to lower the capacitance of the unprogrammed antifuse.

BRIEF DESCRIPTION OF THE DRAWINGS

A more detailed understanding of the present invention may be achieved by perusing the following Detailed Description Of Preferred Embodiments of the present invention with reference to the following drawings.

Figure 2:
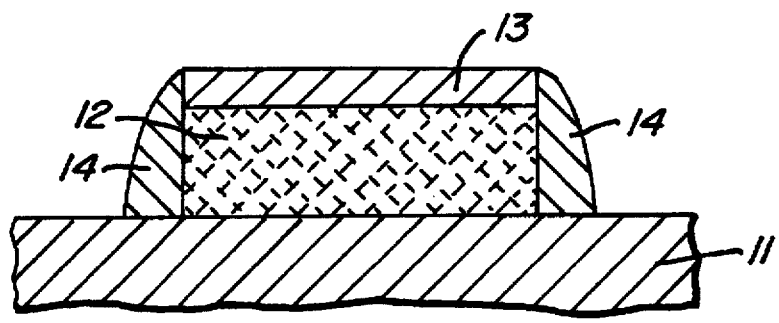
FIG. 2 is a cross-sectional diagram of the results of the next manufacturing step of the antifuse structure of FIG. 1 which begins to diverge from the prior art according to the present invention.
Figure 9:
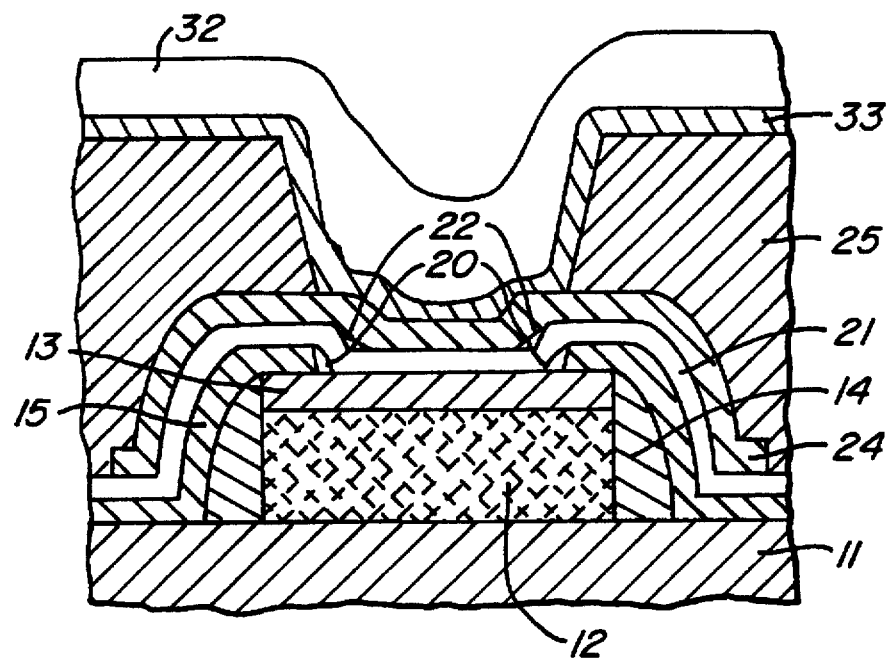

FIGS. 3–8 sequentially illustrate manufacturing steps for the antifuse structure of FIG. 2 according to the present invention;

FIG. 9 is a cross-sectional diagram of the resulting antifuse structure of the previous manufacturing steps according to the present invention.

Figure 10:
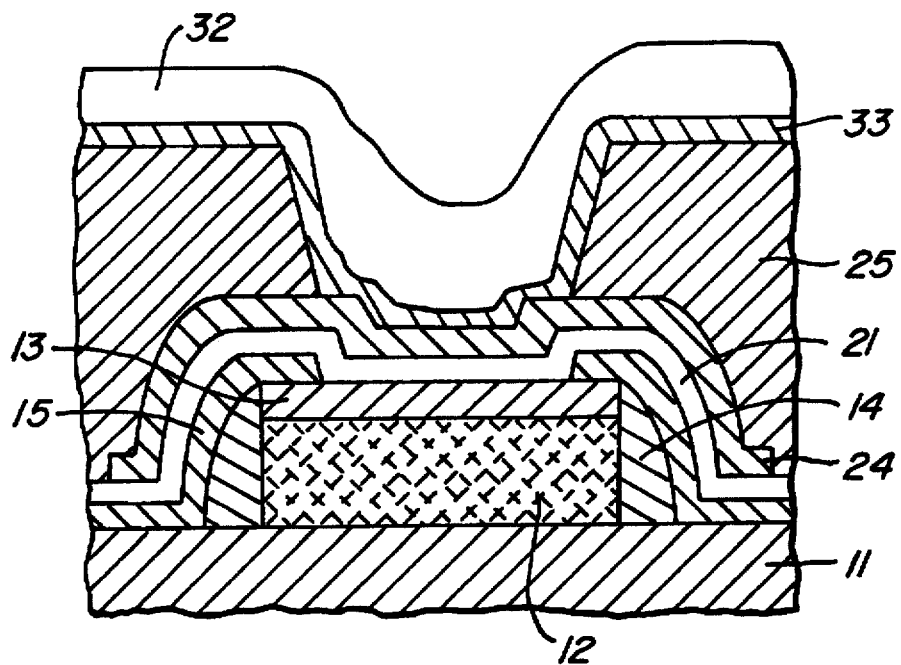

FIG. 10 is a cross-sectional diagram of the resulting antifuse structure of the previous manufacturing steps according to the present invention excluding the spacer regions.

DETAILED DESCRIPTION OF PREFERRED EMBODIMENTS

For all the drawings, it should be noted that the various details are not drawn to scale, but are made to illustrate the various points of the present invention.

Figure 1:
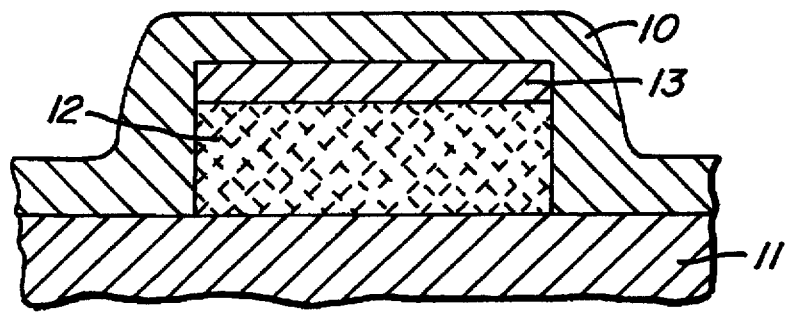
FIG. 1 is a cross-sectional diagram of a formative antifuse structure found in the prior art.

By a cross-sectional view, FIG. 1 shows the initial steps of manufacturing an antifuse. At this stage of manufacture the structure follows the prior art. A first metal interconnection layer on top of an insulating layer 11 of silicon dioxide. The insulating layer 11 is formed on top of a semiconductor substrate (not shown) upon whose surface are formed the various elements of an integrated circuit. These elements, such as transistors, are not shown in the drawings.

The first metal layer is typically formed from an aluminum alloy layer 12 and a first barrier metal layer 13 of titanium-tungsten on top of the aluminum alloy layer 12. Alternatively, the first barrier metal layer 13 may be formed of tungsten, titanium, tungsten silicide, titanium silicide, platinum silicon, or other suitable materials, for example. The layers 12 and 13 are delineated into one set of metal interconnection lines for the integrated circuit. The delineated layer 12 and 13 are then covered by an insulating layer 10, conventionally silicon dioxide or silicon nitride. In FIG. 2, the layer 10 is subjected to an etching process, such as an isotropic etch or a reactive ion etch. Spacers 14 are formed on the sidewalls of the delineated layers 12 and 13. As shown in FIG. 2, the spacers 14 improve the step coverage of a relatively thin insulating layer 15 which is deposited over the first interconnection line (the layers 12 and 13), the spacers 14 and the first insulating layer 11.

Figure 3:
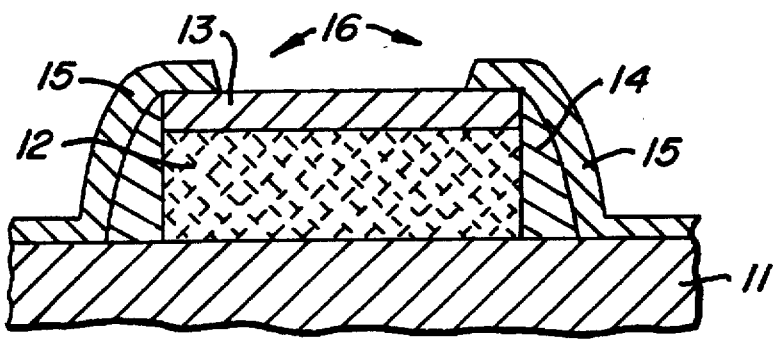

As shown in FIG. 3, a layer 15 is then deposited by chemical vapor deposition to a thickness from 2500 to 3000 Å. The layer 15 is formed from silicon dioxide, such as undoped silicate glass, phosphosilicate glass (PSG), or borophosphosilicate glass (BPSG). With standard photolithographic and etching techniques, such as an isotropic or anisotropic etch, and a via mask, a via 16 is formed in the insulating layer 15 to expose a portion of the top surface of the barrier layer 13 where the antifuse is to be located.

Another way of forming the spacer regions 14 is by a reflow process. The insulating layer 10 may be formed as a deposited layer of borophosphosilicate glass and heated. The heated glass layer "reflows" to partially planarize the features on he insulating layer and the spacer regions 14 are formed on the sides of the first metal interconnection line. Then the via 16 is formed through the reflowed layer 10. The layer 15 is omitted from the process.

Figure 4:
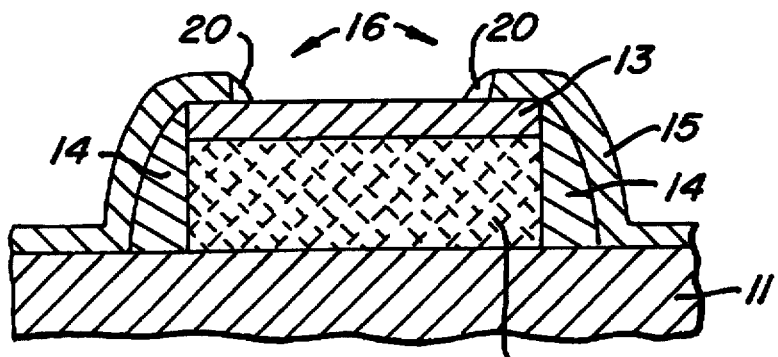

In accordance with the present invention, a spacer-forming layer is deposited over the layer 15 and via 16. Of course, if the reflow process is used, the spacer-forming layer is deposited over the layer 10 and via 16. Amorphous silicon, silicon dioxide or silicon nitride may be used for the spacer-forming layer. An etching step, such as a reactive ion etching, follows to leave spacer regions 20 against the sidewalls of the via 16 as shown in FIG. 4.

Figure 5:
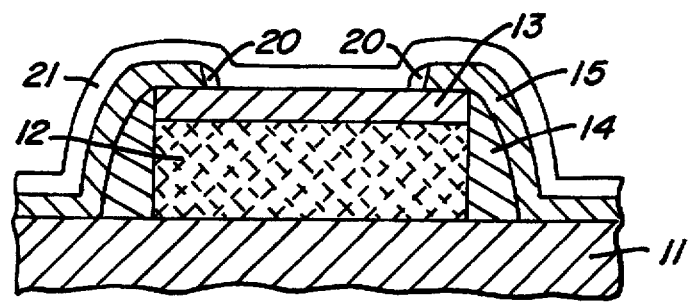

As shown in FIG. 5, a programming layer 21 of amorphous silicon is then deposited by plasma-enhanced chemical vapor deposition. The programming layer may alternatively be silicon oxide, silicon nitride, or a combination of the above programming layer materials, or other suitable materials, for example. In the example in FIG. 5, the programming layer 21 is amorphous silicon containing hydrogen from 8–12% by atomic weight. For a desired programming voltage of approximately 8 volts, the thickness of the amorphous silicon programming layer 21 ranges from 700 to 900 Å. The thin amorphous silicon layer 21, relative to the thickness of the insulating layer 15, follows the contours of the via 16 and the spacer regions 20. Besides the shallowness of the via 16, the reduction in the acute angles of the corners of the via 16 help ensure that the programming layer 21 is uniformly deposited. Folds and other irregularities in the layer 21 are believed to b a cause of irregularities in the programming voltages and a source of instability of $R_{ON}$ after the antifuse is programmed.

The spacers 20 thus desirably flatten the programming layer 21. Nonetheless, since the amorphous silicon layer 21 is thin relative to the height of the via 16, the layer 16 follows the sidewalls of the via and spacers regions 20. Within the via 16 the amorphous silicon layer 21 itself forms sidewalls.

Figure 6:
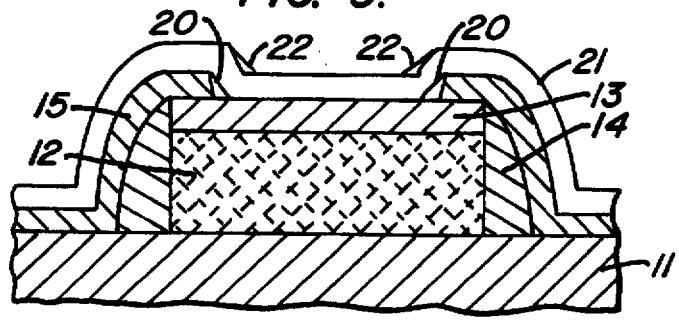

As shown in FIG. 6, spacer regions are placed on the sidewalls of the amorphous silicon layer 21. These regions 22 further round the corners inside the via 16. The regions 22 are created by the deposition of a layer of silicon dioxide or silicon nitride over the layer 21. An etching step follows, which leaves the spacer regions 22 on the sidewalls of the layer 21.

Figure 7:
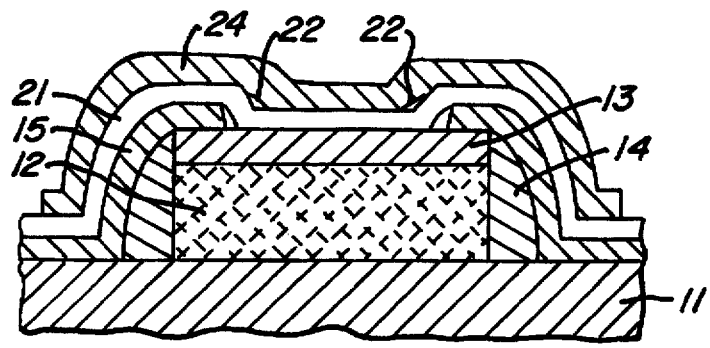

As shown in FIG. 7, a barrier metal layer 24 of TiW is then deposited over the programming layer 21, as illustrated in FIG. 6. As described with regard to the first barrier metal layers, the barrier metal layer 24 may be formed of tungsten, titanium, tungsten silicide, titanium silicide, platinum silicon, or other suitable materials, for example. The barrier metal layer 24 is deposited by sputtering to a thickness of 1000 to 2000 Å. An antifuse mask is used to delineate the layer 24 around the via 16, as illustrated in FIG. 7. Alternatively, the same mask can be used to delineate both layers 24 and 21.

The spacer regions 22 reduces any edges in the layer 24. When an antifuse is programmed by the placement of a large voltage across the programming layer, a conducting link is formed through the programming layer between the metal interconnection layers typically at the corners of the antifuse in the via through the insulating layer. It is believed that the location of the conducting link is determined to a large extent by the strongest electric fields which are present at the acute angles of a metal conductor. In the present invention, the acute angles of the metal conductors are significantly reduced. The surface of the barrier metal 13 contacting the programming layer 21 is flat and the edges of the barrier metal layer 24 are reduced by the spacer regions 22 (and 20).

Figure 8:
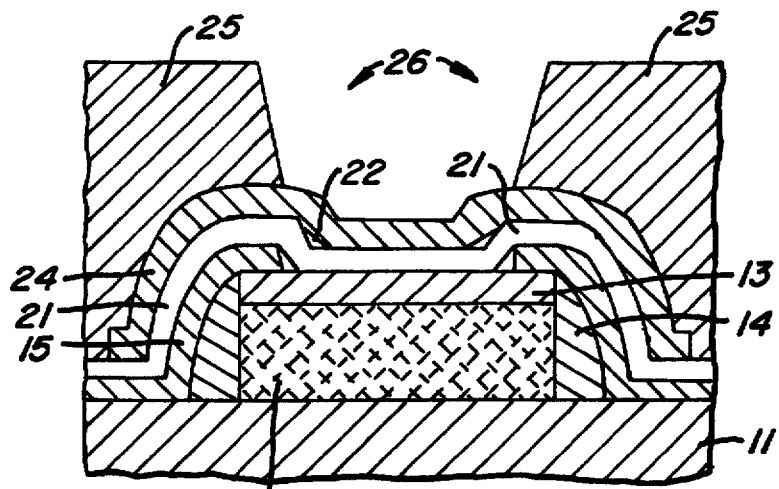

As shown in FIG. 8, a thick insulating layer 25 of silicon dioxide, which forms the interlayer dielectric, is then deposited to blanket the layers 21 and 24. From the top surface of the first insulating layer 11, the layer 25, which may be formed from undoped silicate glass, BPSG, or PSG, has a thickness in the range from 5000 to 12000 Å. As shown in FIG. 8, a via 26 is defined and formed through the layer 25 to expose a top surface of the barrier metal layer 24.

As shown in FIG. 9, by sputtering, a barrier metal layer 33 of 33 of TiW is deposited to a thickness of 1000 to 2000 Å. This is followed by a layer 32 of aluminum alloy, for example, sputtered to a thickness of 5000 to 7000 Å.

With a second interconnection line mask, the layers 32 and 33 are masked and etched by standard photolithographic and etching techniques. The second set of interconnection lines are formed from the TiW layer 33 and the aluminum alloy layer 32.

The completed antifuse structure is shown in FIG. 9. Not shown are the layers, such as the passivating layers, which are deposited subsequently to complete the integrated circuit. The advantage of this antifuse is that the programming layer 21 has a uniform thickness in the via 16. The spacer regions 20 and 22 force the programming toward the center and away from the sides of the via 16. In this location the programming layer 21 is uniform leading to a more likely uniformity in programming voltages of all the antifuses in the FPGA and stability of $R_{ON}$ over time. Furthermore, since corners in vias are covered by spacer regions, leakage currents in the unprogrammed antifuses are reduced or eliminated.

Finally, the antifuse structure has a capacitance limited largely by the area of the contact between the TiW layer 24 and the amorphous silicon layer 21. This area is capacitively defined, to a significant extent, by the contact area within the spacer regions 22. Thus the present invention reduces the capacitance of the antifuse structure. Over the many tens of thousands of antifuses found in a present day FPGA, the present invention offers a significant reduction in the parasitic capacitances of the unprogrammed antifuses and, hence, an increase in the operating speeds of the integrated circuit.

FIG. 10 illustrates another embodiment of a complete antifuse structure. Beginning with the structure as shown in FIG. 1, the processing steps of the present invention are performed except forming the spacer regions 20 and 22. Adding spacer regions 20 and 22 is within the scope of this embodiment.

While the above is a complete description of the preferred embodiments of the invention, various alternatives, modifications and equivalents may be used. It should be evident that the present invention is equally applicable by making appropriate modifications to the embodiments described above. For example, the amorphous silicon layer doped with oxygen may be used as a programming layer in other antifuse structure than those disclosed above. Therefore, the above description should not be taken as limiting the scope of the invention which is defined by the appended claims.

What is claimed is:

1. An antifuse structure in an integrated circuit comprising a first metal interconnection layer on a first insulating layer;

a relatively thin, second insulating layer over said first metal interconnection layer and said first insulating layer, said second insulating layer having a first aperture therethrough where the antifuse structure is to be located, said first aperture forming sides of said second insulating layer;

a first spacer region in said first aperture on said sides of said second insulating layer;

a programming layer on said second insulating layer and on said first spacer region contacting said first metal interconnection layer, said programming layer conformally following said first spacer region into said first aperture, and forming sides of said programming layer, said first spacer region comprising a material used for said programming layer;

a second spacer region on said sides of said programming layer;

a barrier metal layer on said programming layer and on said second spacer region contacting said programming layer;

a relatively thick, third insulating layer on said barrier metal layer, said third insulating layer having a second aperture therethrough exposing a portion of said barrier metal layer; and a second metal interconnection layer on said third insulating layer contacting said portion of said barrier metal layer;

whereby said first and second spacer regions force programming away from said sides of said second insulating layer permitting a relatively consistent programming voltage for the antifuse structure and a relatively uniform conducting link between said first and second metal interconnection layers.

2. The antifuse structure of claim 1 wherein said material used for said first spacer region and said programming layer comprises amorphous silicon.

3. The antifuse structure of claim 1 wherein said second spacer region comprises silicon dioxide.

4. The antifuse structure of claim 1 wherein said second spacer region comprises silicon nitride.

5. The antifuse structure of claim 1 wherein said second spacer region comprises a material used for said programming layer.

6. The antifuse structure of claim 1 wherein said second insulating layer has a thickness from 2500 to 3000 Å.

7. The antifuse structure of claim 1 wherein said third insulating layer has a thickness from 5000 to 12000 Å.

8. The antifuse structure of claim 1 wherein said first metal interconnection layer comprises a barrier metal layer on an aluminum alloy layer.

9. An antifuse structure in an integrated circuit comprising:

a first metal interconnection layer on a first insulating layer;

a relatively thin, second insulating layer over said first metal interconnection layer and the first insulating layer, said second insulating layer having a first aperture therethrough exposing said first metal interconnection layer and said second insulating layer having sides that are sloped;

a programming layer on said second insulating layer contacting said first metal interconnection layer, said programming layer conformally following said second insulating layer into said first aperture and forming sides of said programming layer;

a spacer region on said sides of said programming layer;

a barrier metal layer on said programming layer and on said spacer region contacting said programming layer;

a relatively thick, third insulating layer on said barrier metal layer, said third insulating layer having a second aperture therethrough exposing a porion of said barrier metal layer; and a second metal interconnection layer on said third insulating layer contacting said portion of said barrier metal layer.

10. The antifuse structure of claim 9 wherein said second insulating layer comprises boron and phosphorus doped silicon glass.

11. The antifuse structure of claim 9 wherein said second insulating layer has a thickness from 2500 to 3000 Å.

12. The antifuse structure of claim 9 wherein said third insulating layer has a thickness from 5000 to 12000 Å.

13. The antifuse structure of claim 9 wherein said first metal interconnection layer comprises an aluminum alloy and a barrier metal layer.

14. An antifuse structure in an integrated circuit including a first insulating layer on a substrate comprising:

a first metal interconnection layer on the first insulating layer;

a spacer region over said substrate and adjacent to said first metal interconnection layer and the first insulating layer;

a relatively thin, second insulating layer over said first metal interconnection layer and over said spacer region, said second insulating layer having a first aperture therethrough exposing said first metal interconnection layer, said first aperture forming sides of said second insulating layer;

a second spacer region in said first aperture on said sides of said second insulating layer;

a programming layer on said second insulating layer contacting said first metal interconnection layer;

a barrier metal layer on said programming layer contacting said programming layer;

forming a relatively thick, third insulating layer on said barrier metal layer, said third insulating layer having a second aperture there through exposing a porion of said barrier metal layer; and a second metal interconnection layer on said third insulating layer contacting said portion of said barrier metal layer.

15. The antifuse structure of claim 14 wherein said spacer region comprises a phosphorus doped silicon glass.

16. The antifuse structure of claim 14 wherein said spacer region comprises a material used for forming said second insulating layer.

17. An antifuse structure in an integrated circuit including a first insulating layer on a substrate comprising:

a first metal interconnection layer on the first insulating layer;

a spacer region over said substrate and adjacent to said first metal interconnection layer and the first insulating layer, said spacer region comprising a phosphorous doped silicon glass;

a relatively thin, second insulating layer over said first metal interconnection layer and said spacer region, said second insulating layer having a first aperture therethrough exposing said first metal interconnection layer, said first aperture forming sides of said second insulating layer;

a second spacer region in said first aperture on said sides of said second insulating layer;

a programming layer on said second insulating layer and on said second spacer region contacting said first metal interconnection layer, said programming layer conformally following said first spacer region into said first aperture, and forming sides of said programming layer;

a third spacer region on said sides of said programming layer;

a barrier metal layer on said programming layer and on the third spacer region contacting said programming layer;

forming a relatively thick, third insulating layer on said barrier metal layer, said third insulating layer having a second aperture there through exposing a porion of said barrier metal layer; and a second metal interconnection layer on said third insulating layer contacting said portion of said barrier metal layer.

18. An antifuse structure in an integrated circuit comprising a first metal interconnection layer on a first insulating layer;

a relatively thin, second insulating layer over said first metal interconnection layer and said first insulating layer, said second insulating layer having a first aperture therethrough where the antifuse structure is to be located, said first aperture forming sides of said second insulating layer;

a first spacer region in said first aperture on said sides of said second insulating layer;

a programming layer on said second insulating layer and on said first spacer region contacting said first metal interconnection layer, said programming layer conformally following said first spacer region into said first aperture, and forming sides of said programming layer;

a second spacer region on said sides of said programming layer said second spacer region comprising a material used for said programming layer;

a barrier metal layer on said programming layer and on said second spacer region contacting said programming layer;

a relatively thick, third insulating layer on said barrier metal layer, said third insulating layer having a second aperture therethrough exposing a portion of said barrier metal layer; and a second metal interconnection layer on said third insulating layer contacting said portion of said barrier metal layer;

whereby said first and second spacer regions force programming away from said sides of said second, insulating layer permitting a relatively consistent programming voltage for the antifuse structure and a relatively uniform conducting link between said first and second metal interconnection layers.

19. The antifuse structure of claim 18 wherein said first spacer region comprises a material used for said programming layer.

20. The antifuse structure of claim 18 wherein said material used for said second spacer region and said programming layer comprises amorphous silicon.

21. The antifuse structure of claim 18 wherein said first spacer region comprises silicon dioxide.

22. The antifuse structure of claim 18 wherein said first spacer region comprises silicon nitride.

23. The antifuse structure of claim 18 wherein said second insulating layer had a thickness from 2500 to 3000 Å.

24. The method of claim 18 wherein said third insulating layer has a thickness from 5000 to 12000 Å.

25. The method of claim 18 wherein said first metal interconnection layer comprises a barrier metal layer on an aluminum alloy layer.

26. The antifuse structure of claim 9 wherein the spacer region comprises a material used for said programming layer.

27. The antifuse structure of claim 9 wherein the spacer region comprises amorphous silicon.

28. An antifuse structure in an integrated circuit comprising:
- a first metal interconnection layer on a first insulating layer;
- a relatively thin, second insulating layer over said first metal interconnection layer and the first insulating layer, said second insulating layer having a first aperture therethrough exposing said first metal interconnection layer and said second insulating layer having sides that are sloped;
- a programming layer on said second insulating layer contacting said first metal interconnection layer, said programming layer having sides;
- a spacer region on said sides of said programming layer;
- a barrier metal layer on said programming layer and on said spacer region contacting said programming layer;
- a relatively thick, third insulating layer on said barrier metal layer, said third insulating layer having a second aperture therethrough exposing a porion of said barrier metal layer, said third insulating layer having a thickness from 5000 to 12000 Å; and
- a second metal interconnection layer on said third insulating layer contacting said portion of said barrier metal layer.

29. The antifuse structure of claim 28 wherein said second insulating layer comprises boron and phosphorous doped silicon glass.

30. The antifuse structure of claim 28 wherein said second insulating layer has a thickness from 2500 to 3000 Å.

31. The antifuse structure of claim 28 wherein said first metal interconnection layer comprises an aluminum alloy and a barrier metal layer.

32. The antifuse structure of claim 28 wherein the spacer region comprises a material used for said programming layer.

33. The antifuse structure of claim 28 wherein the spacer region comprises amorphous silicon.

34. The antifuse structure of claim 14 wherein the second spacer region comprises amorphous silicon.

35. The antifuse structure of claim 17 wherein the second spacer region comprises a material used for said programming layer.

36. The antifuse structure of claim 17 wherein the second spacer region comprises amorphous silicon.

37. The antifuse structure of claim 17 wherein the third spacer region comprises a material used for said programming layer.

38. The antifuse structure of claim 17 wherein the third spacer region comprises amorphous silicon.

* * * * *